US012812814B2

(12) United States Patent
Hung

(10) Patent No.: US 12,812,814 B2
(45) Date of Patent: Nov. 24, 2026

(54) HEAT SINK DEVICE

(71) Applicant: Delta Electronics, Inc., Taoyuan City (TW)

(72) Inventor: Tsung-Chi Hung, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 158 days.

(21) Appl. No.: 18/915,787

(22) Filed: Oct. 15, 2024

(65) Prior Publication Data

US 2025/0386459 A1 Dec. 18, 2025

(30) Foreign Application Priority Data

Jun. 14, 2024 (CN) ......................... 202410767655.5

(51) Int. Cl.
*H05K 7/20* (2006.01)

(52) U.S. Cl.
CPC .................................. *H05K 7/2039* (2013.01)

(58) Field of Classification Search
CPC . H10W 40/226; H10W 40/037; H05K 7/2039
USPC ........................................................ 165/80.3
See application file for complete search history.

(56) References Cited

U.S. PATENT DOCUMENTS

2022/0030739 A1* 1/2022 Bucher ................ H05K 7/2049
2022/0377945 A1* 11/2022 Rademacher ...... H05K 7/20409

* cited by examiner

*Primary Examiner* — Steve S Tanenbaum
(74) *Attorney, Agent, or Firm* — MUNCY, GEISSLER, OLDS & LOWE, P.C.

(57) ABSTRACT

A heat sink device is provided, including a heat sink main body and a gripping member assembly. The gripping member assembly has a pair of gripping members respectively disposed on opposite lateral walls of the heat sink main body. Each of the gripping members includes a gripping hole. When the gripping member assembly is in a first position relative to the heat sink main body, the gripping holes are situated at the lateral walls of the heat sink main body. When the gripping member assembly moves relative to the heat sink main body from the first position to a second position, the gripping holes are extended along a first direction and protrude from the lateral walls of the heat sink main body.

11 Claims, 9 Drawing Sheets

A-A

HEAT SINK DEVICE

CROSS REFERENCE TO RELATED APPLICATIONS

The present application claims priority of China Patent Application No. 202410767655.5, filed Jun. 14, 2024, which is incorporated by reference herein in its entirety.

BACKGROUND OF THE INVENTION

Field of the Invention

The application relates in general to a heat sink device, and in particular, to a heat sink device that enables the heat sink to be assembled manually and automatically.

Description of the Related Art

Due to the rapid development of Internet and computer technology, there has been an increase in the computing and processing capabilities of electronic apparatuses (such as the converter), as well as in their power. The operating temperature of these electronic apparatuses has increased accordingly. Therefore, it is necessary to mount a heat sink with larger dimensions and more weight.

In general, current heat sinks are transported and mounted manually. However, when the dimensions or the weight of the heat sink increases, this makes it harder to assemble the heat sink manually. Moreover, besides the aforementioned transportation and mounting problems, how to match the transportation process of the automatic equipment at the same time has become an important issue that needs to be solved.

BRIEF SUMMARY OF INVENTION

To address the deficiencies of conventional products, an embodiment of the invention provides a heat sink device. The heat sink device includes a heat sink main body and a gripping member assembly. The gripping member assembly has a pair of gripping members respectively disposed on opposite lateral walls of the heat sink main body. Each of the gripping members includes a gripping hole. When the gripping member assembly is in a first position relative to the heat sink main body, the gripping holes are situated at the lateral walls of the heat sink main body. When the gripping member assembly moves relative to the heat sink main body from the first position to a second position, the gripping holes extend along a first direction and protrude from the lateral walls of the heat sink main body.

In some embodiments, each gripping member has a guiding slot, and the heat sink device includes a fixing member passing through the guiding slot and connected to the heat sink main body.

In some embodiments, each gripping member includes a first recess and a second recess, and the heat sink device includes an elastic member disposed between the heat sink main body and one of the gripping members. When the gripping member assembly is in the first position relative to the heat sink main body, the elastic member enters the first recess. When the gripping member assembly is in the second position relative to the heat sink main body, the elastic member enters the second recess.

In some embodiments, each gripping member includes a through hole corresponding to a protruding pillar on a telescopic clamp of a mechanical arm.

In some embodiments, the heat sink device provides a magnetic member or a vacuum suction nozzle disposed on a mechanical arm for gripping the heat sink main body.

An embodiment of the invention also provides a heat sink device, including a heat sink main body, a cover, and a gripping member assembly. The cover is affixed to the heat sink main body. The gripping member assembly has a pair of gripping members respectively disposed on opposite lateral walls of the heat sink main body. Each of the gripping members includes a gripping hole. When the gripping member assembly is in a first position relative to the heat sink main body, the gripping holes are situated at the lateral walls of the heat sink main body. When the gripping member assembly moves relative to the heat sink main body from the first position to a second position, the gripping holes extend along a first direction and protrude from the lateral walls of the heat sink main body.

In some embodiments, each gripping member comprises a guiding slot, and the heat sink device comprises a fixing member passing through the guiding slot and connected to the cover.

In some embodiments, each gripping member comprises a first recess and a second recess, and the heat sink device comprises an elastic member disposed between the cover and one of the gripping members, wherein when the gripping member assembly is in the first position relative the heat sink main body, the elastic member enters the first recess, wherein when the gripping member assembly is in the second position relative to the heat sink main body, the elastic member enters the second recess.

In some embodiments, each gripping member comprises a through hole corresponding to a protruding pillar on a telescopic clamp of a mechanical arm.

In some embodiments, a depression portion is formed on the cover, and the depression portion corresponds to the through hole when the gripping member assembly is in the first position relative to the heat sink main body.

In some embodiments, the heat sink device provides a magnetic member or a vacuum suction nozzle disposed on a mechanical arm for gripping the heat sink main body.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the heat sink device are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
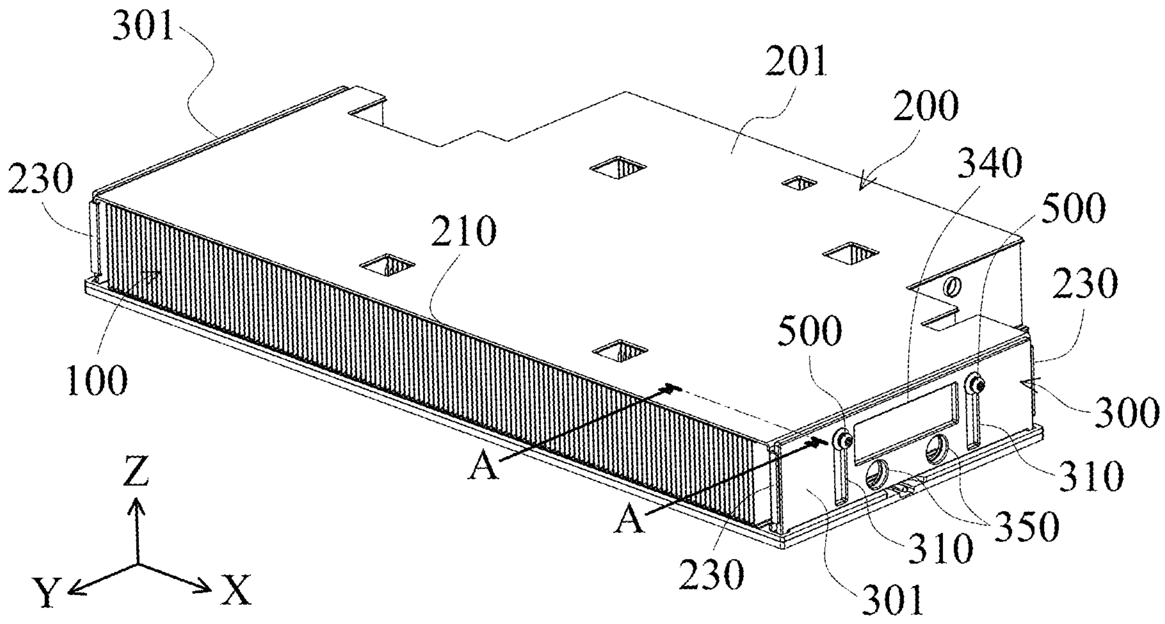
FIG. 1 is a schematic diagram of a heat sink device according to an embodiment of the invention.
Figure 2:
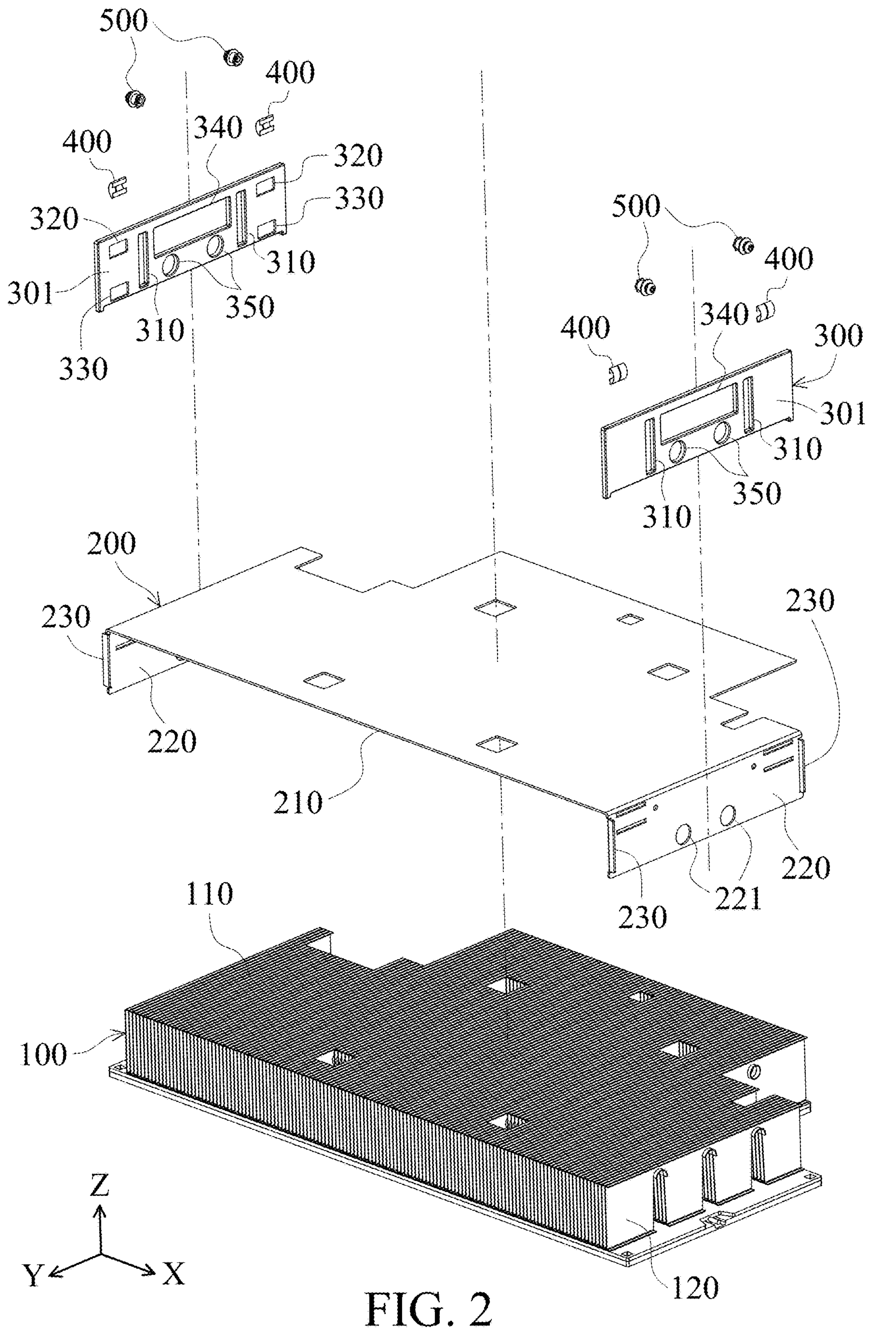
FIG. 2 is an exploded-view diagram of the heat sink device according to an embodiment of the invention.

Referring to FIG. 1 and FIG. 2, in an embodiment of the invention, a heat sink device primarily includes a heat sink main body 100, a cover 200, a gripping member assembly 300, at least one elastic member 400, and at least one fixing member 500. The heat sink main body 100 can be disposed in an electronic device that is required to dissipate heat and connected to an electronic member in the electronic device that generating heat (such as the central processing unit (CPU), the graphics processing unit (GPU), and/or the hard disk, but it is not limited thereto), so as to reduce the temperature of the electronic device during the operation. For example, the heat sink main body 100 can be made of metal, and can include a plurality of fins that are parallel to each other.

The cover 200 can also be made of metal. The cover 200 can be connected to the heat sink main body 100, and can enclose the heat sink main body 100. In detail, the cover 200 includes a top wall 210, two lateral walls 220, and a plurality of positioning protrusions 230. Two lateral walls 220 are connected to the top wall 210 at the opposite sides of the top wall 210. When the cover 200 is connected to the heat sink main body 100, the top wall 210 covers the upper surface 110 of the heat sink main body 100, and the lateral walls 220 cover the lateral walls 120 of the heat sink main body 100. It should be noted that, each lateral wall 220 is spaced away from the adjacent lateral wall 120 of the heat sink main body 120 (the fins of the heat sink main body 100), so that the heat dissipation effect can be ensured.

The positioning protrusions 230 are connected to the lateral walls 220 of the cover 200, and protrude from the lateral walls 220. In this embodiment, each lateral wall 220 is connected to two positioning protrusions 230, and the distance between the positioning protrusions 230 on each lateral wall 220 is substantially the same as the width of the gripping member 301 of the gripping member assembly 300. Therefore, the positioning protrusions 230 can limit the position of the gripping member 301.

Moreover, in this embodiment, one or more depression portions 221 are formed on each lateral wall 220 of the cover 200.

In this embodiment, the gripper member assembly 300 includes a pair of gripping members 301 respectively disposed on the lateral walls 120 of the heat sink main body 100. Each gripping member 301 substantially has a plate structure, and includes at least one guiding slot 310, at least one first recess 320, at least one second recess 330, a gripping hole 340, and at least one through hole 350. The guiding slot 310 has a longitudinal structure. The fixing member 500 can pass through the guiding slot 310 and affix to the cover 200, so that the gripping member 301 can be movably connected to the cover 200. In particular, the gripping member 301 can move along the guiding slot 310 relative to the cover 200 and the heat sink main body 100. For example, the fixing member 500 can be a screw or a rivet, but it is not limited thereto.

The first recess 320 and the second recess 330 are formed on the surface of the gripping member 301 facing the heat sink main body 100, and are arranged along the longitudinal direction of the guiding slot 310. The gripping hole 340 penetrates the gripping member 301. The dimensions of the gripping hole 310 is greater than the dimensions of the guiding slot 310 and the dimensions of the through hole 350. The position of the through hole 350 corresponds to the position of the depression portion 221 on the cover 200.

Figure 3:
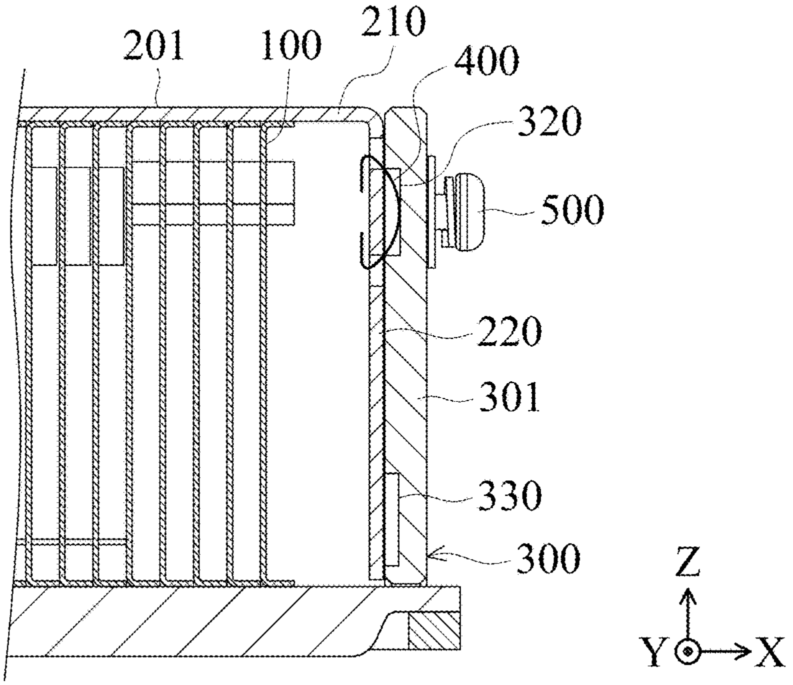
FIG. 3 is a cross-sectional view along line A-A in FIG. 1.

FIG. 3 is a cross-sectional view along line A-A in FIG. 1. As shown in FIG. 1 and FIG. 3, the elastic member 400 is affixed to the cover 200, disposed between the heat sink main body 100 and the gripping member 301, and protrudes from the lateral wall 220 of the cover 200. When the gripping member assembly 300 is in a first position relative to the heat sink main body 100 (i.e. the position shown in FIG. 1 and FIG. 3), the top of the gripping member 301 is aligned with or lower than the upper surface 201 of the cover 200. In other words, the gripping member 301 does not protrude from the upper surface 201 of the cover 200, so that the dimensions of the whole device can be miniaturized, and the problem that the heat sink device cannot put in the electronic device can be prevented. The gripping hole 340 of the gripping member 301 is situated the lateral wall 120 of the heat sink main body 100, and the gripping hole 340 of the gripping member 301 is overlapped with the heat sink main body 100 as observed from the direction facing the lateral wall 120 of the heat sink main body 100. Also, the elastic member 400 enters the first recess 320 of the gripping member 301, so as to affix the gripping member 301 at the first position.

For example, the elastic member 400 can be a metal sheet spring or other suitable deformable material, but it is not limited thereto.

Figure 4:
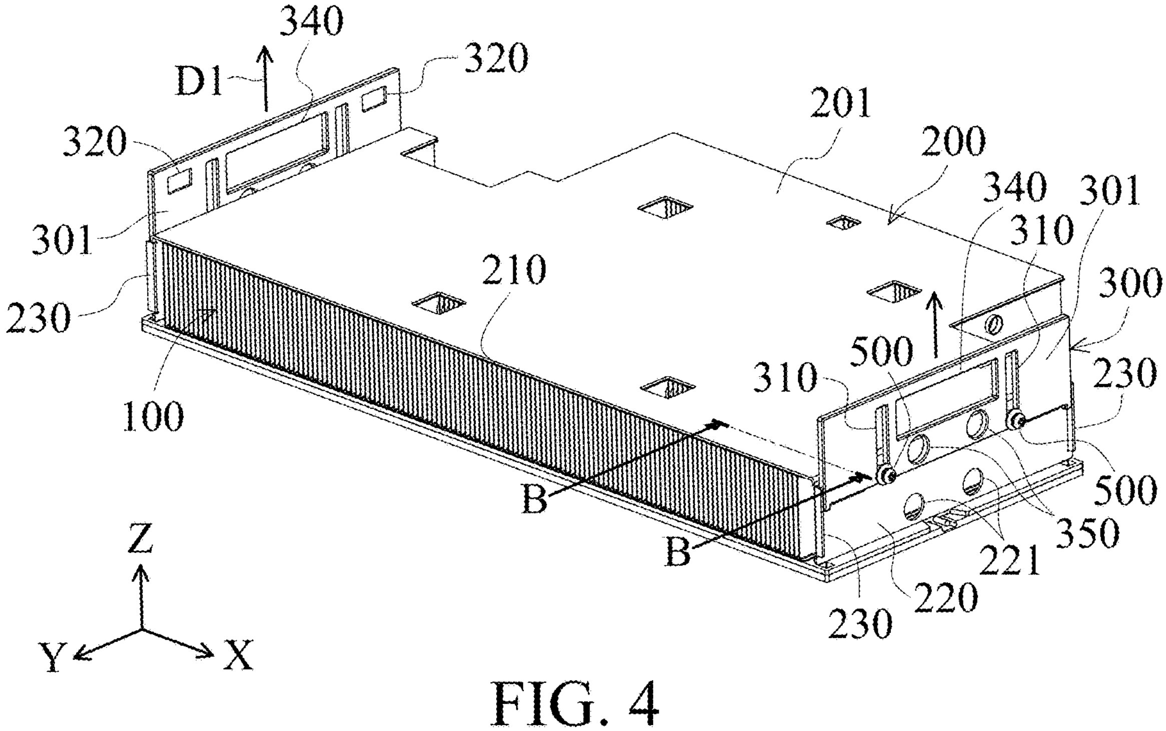
FIG. 4 is a schematic diagram representing that the gripping member assembly moves from the first position to the second position according to an embodiment of the invention.
Figure 5:
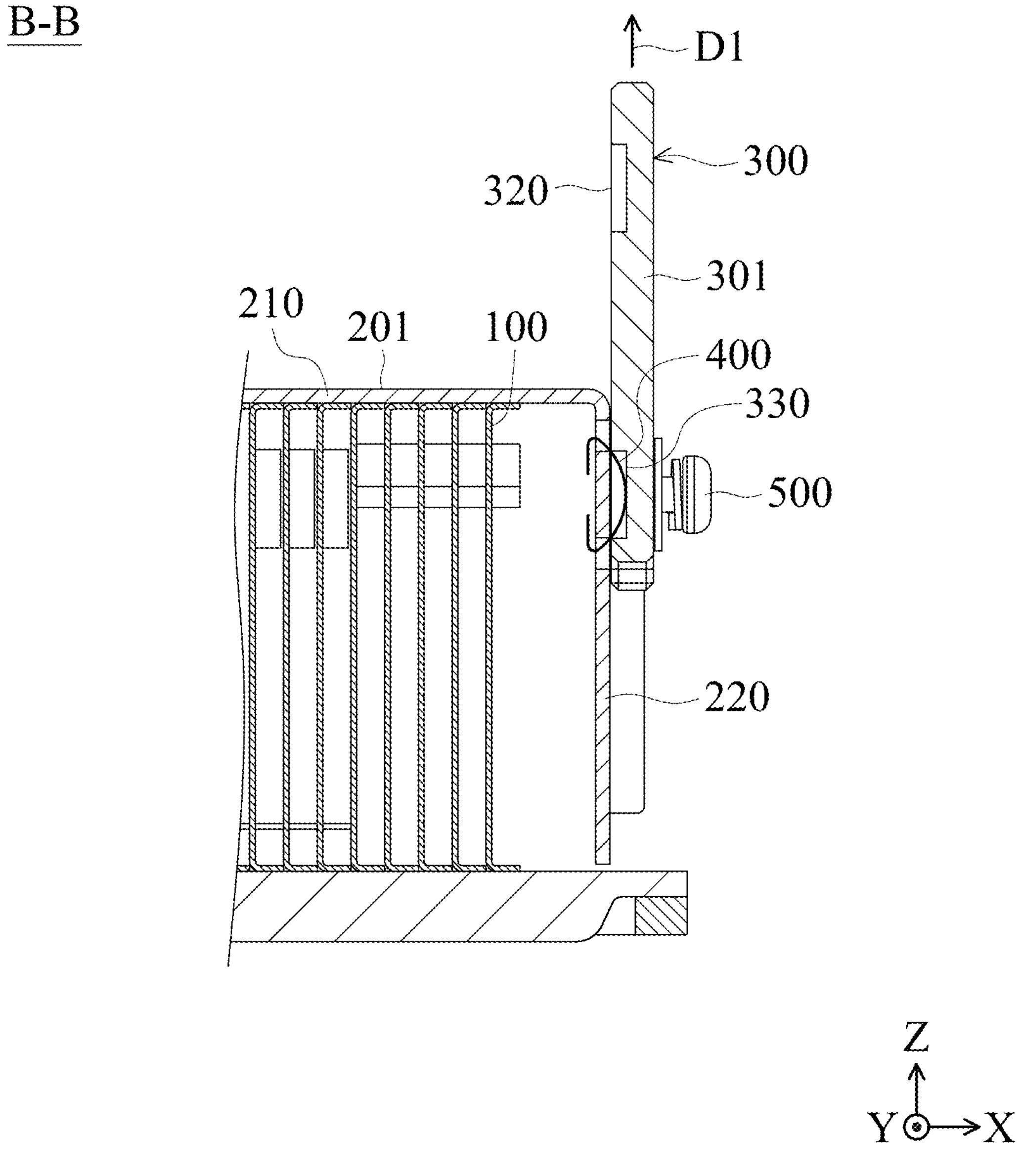
FIG. 5 is a cross-sectional view along line B-B in FIG. 4.

As shown in FIG. 4 and FIG. 5, when the user wants to use the gripping member assembly 300 to grip the heat sink main body 100, the user can apply a force on the gripping member assembly 300 to move the gripping member assembly 300 relative to the heat sink main body 100 from the first position to a second position. The elastic member 400 can be deformed, and leave the first recess 320 and enter the second recess 330. The gripping member assembly 300 can be therefore affixed in the second position relative to the heat sink main body 100. When the gripping member assembly 300 moves relative to the heat sink main body 100 from the first position to the second position, the gripping hole 340 of the gripping member 301 can be extended along a first direction D1 from the lateral wall 120 of the heat sink main body 100 and protrudes from the lateral wall 120. In other words, the gripping hole 340 of the gripping member 301 can protrude from the upper surface 201 of the cover 200. Therefore, the user can use the gripping hole 340 to transport the gripping member assembly 300, and the cover 200 and the heat sink main body 100 connected thereto.

Figure 6:
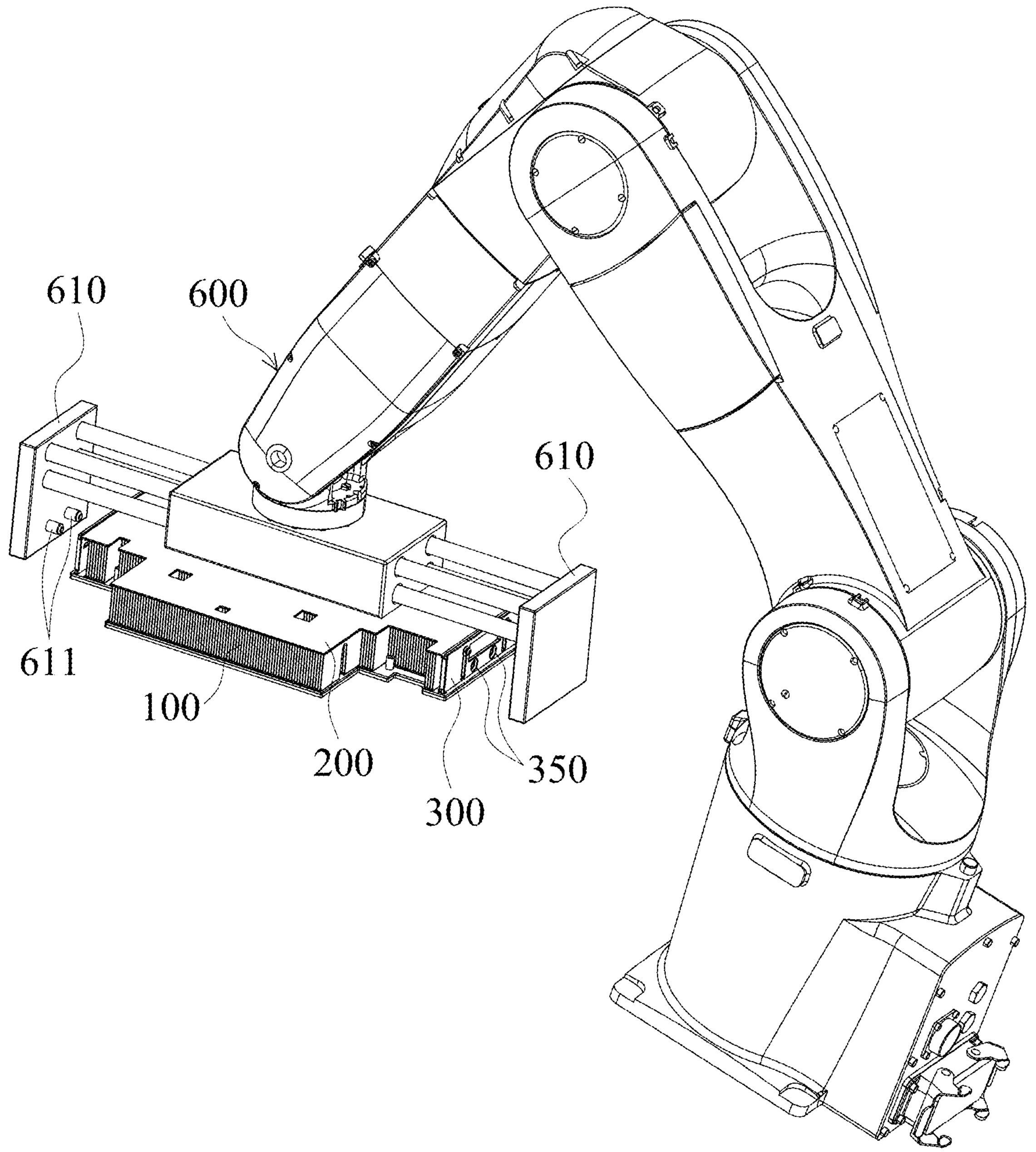
FIG. 6 is a schematic diagram of the heat sink device to an embodiment of the invention.

Owing to the aforementioned structures, the heat sink main body 100 can be manually transported, and also can be automatically transported by the mechanical arm. For example, as shown in FIG. 6, in an embodiment of the invention, the heat sink device can further include a mechanical arm 600. The mechanical arm 600 includes a telescopic clamp 610, and the telescopic clamp 610 has at least one protruding pillar 611. When the user wants to use the mechanical arm 600 to transport, the gripping member assembly 300 can be in the first position relative to the heat sink main body 100. At this time, the through hole 350 of each gripping member 301 and the depression portion 221 of the cover 200 are aligned with each other. The telescopic clamp 610 of the mechanical arm 600 can move toward the head sink main body 100, and the protruding pillar 611 of the telescopic clamp 610 can enter the through hole 350 and the depression portion 221. Therefore, the telescopic clamp 610 can grip the heat sink main body 100, and the heat sink main body 100 can be transported by the mechanical arm 600.

Figure 7:
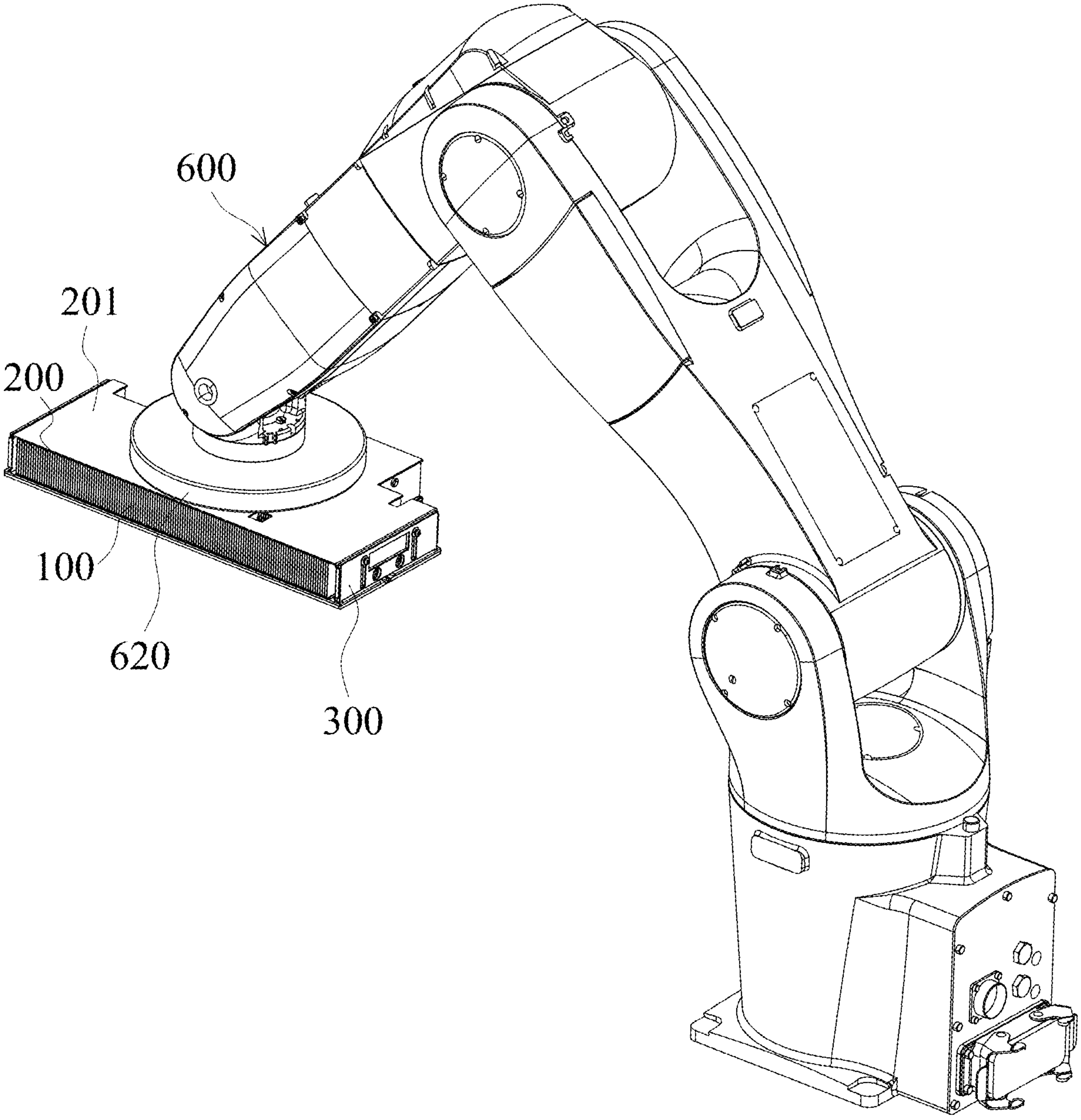
FIG. 7 is a schematic diagram of a heat sink device according to another embodiment of the invention.

As shown in FIG. 7, in another embodiment of the invention, the mechanical arm 600 includes a magnetic member 620 (such as an electromagnet). The magnetic member 620 can be in contact with the upper surface 201 of the cover 200 and attract the cover 200 by the magnetic attracting force, so as to transport the heat sink main body 100 that is connected to the cover 200. Since the gripping member assembly 300 does not protrude from the upper surface 201 of the cover 200 when the gripping member assembly 300 is in the first position, the gripping member assembly 300 does not interfere with the mechanical arm 600 when the magnetic member 620 of the mechanical arm 600 attracts the cover 200.

Figure 8:
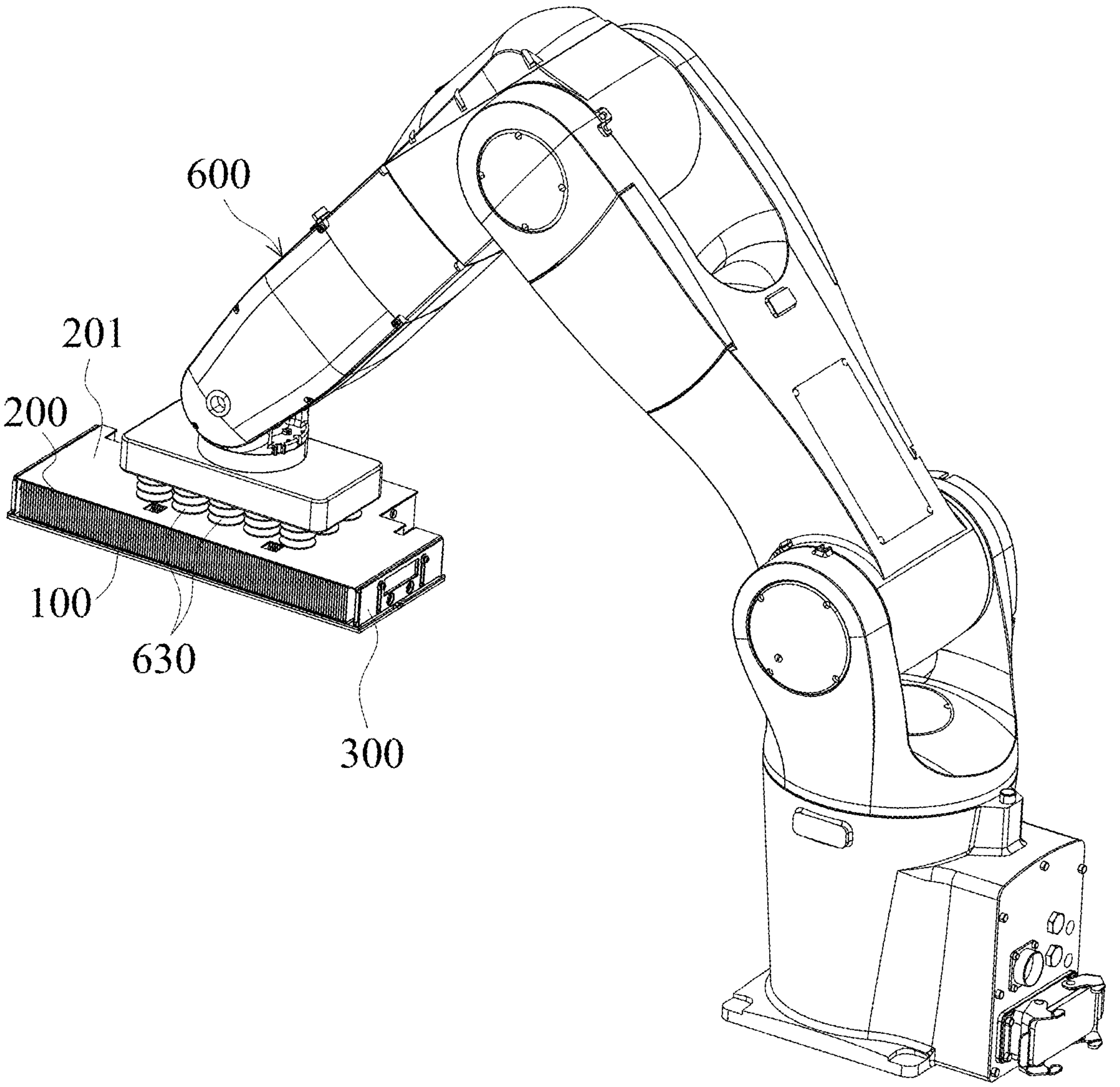
FIG. 8 is a schematic diagram of a heat sink device r according to another embodiment of the invention.

As shown in FIG. 8, in another embodiment of the invention, the mechanical arm 600 includes a vacuum suction nozzle 630 that is connected to a vacuum generator (not shown). When it is required to grip the heat sink main body 100, the vacuum suction nozzle 630 can be in contact with the upper surface 201 of the cover 200, and the vacuum generator can exhaust the gas through the vacuum suction nozzle 630. Therefore, the cover 200 can be sucked, and the heat sink main body 100 that is connected to the cover 200 can be transported. Similarly, since the gripping member assembly 300 does not protrude from the upper surface 201 of the cover 200 when the gripping member assembly 300 is in the first position, the gripping member assembly 300 does not interfere with the mechanical arm 600 when the vacuum suction nozzle 630 of the mechanical arm 600 sucks the cover 200.

Figure 9:
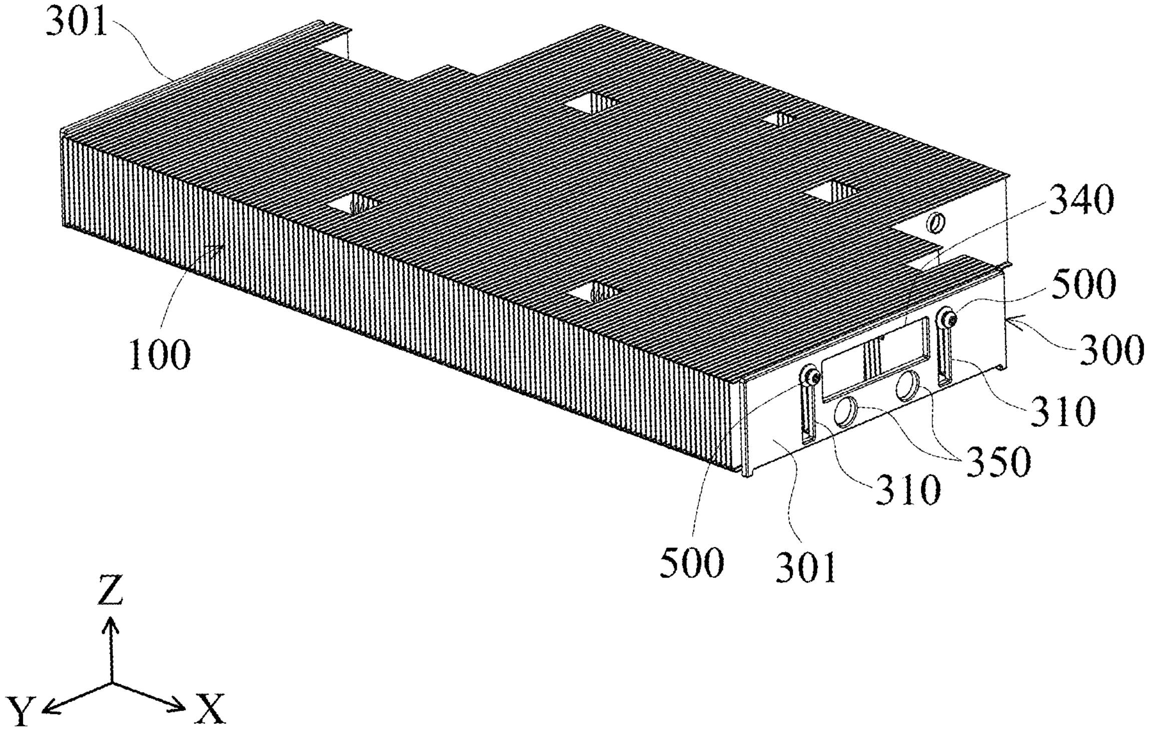
FIG. 9 is a schematic diagram of a heat sink device according to another embodiment of the invention.
Figure 10:
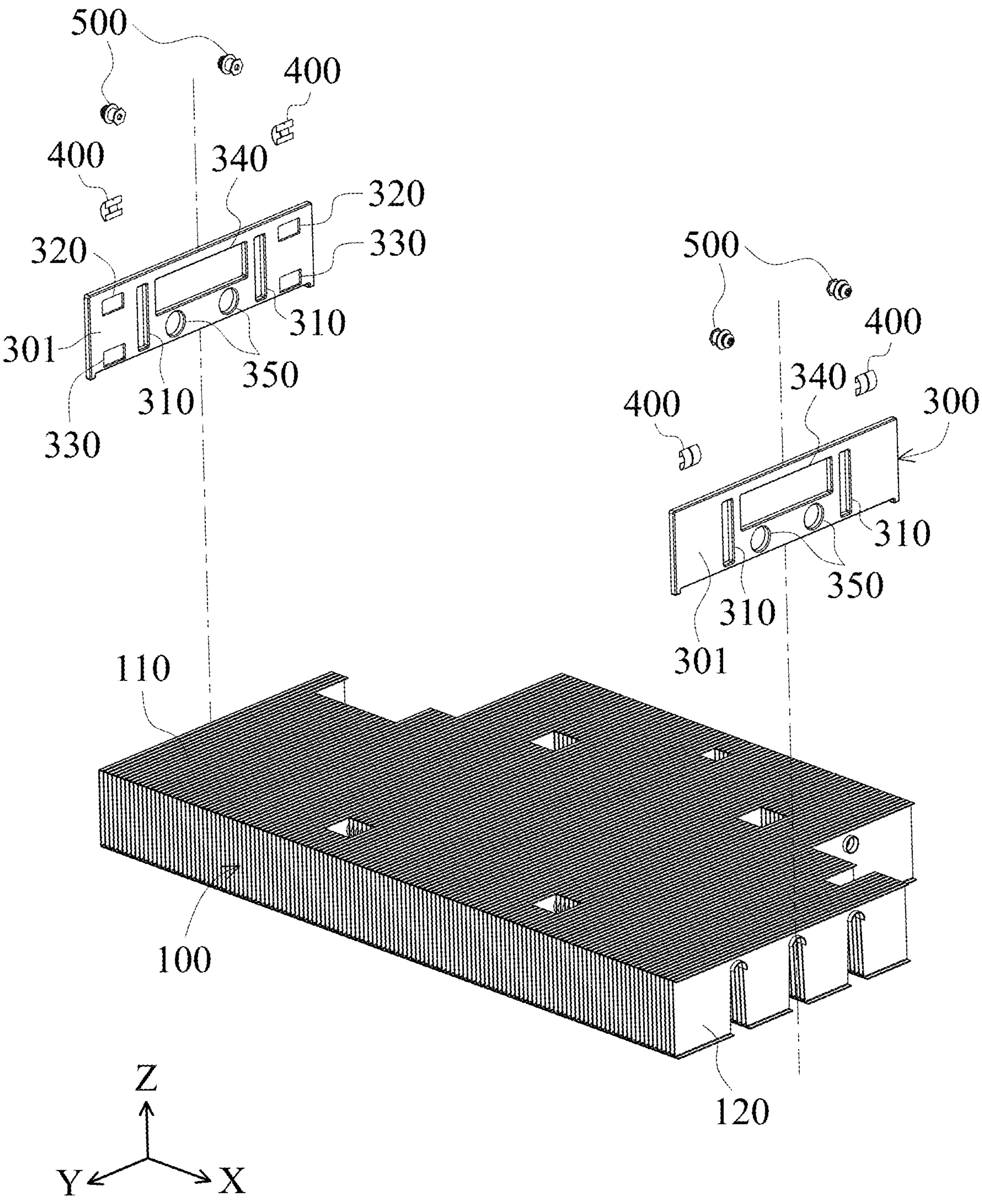
FIG. 10 is an exploded-view diagram of the heat sink device according to another embodiment of the invention.

Referring to FIG. 9 and FIG. 10, in another embodiment of the invention, the heat sink device includes a heat sink main body 100, a gripping member assembly 300, at least one elastic member 400, and at least one fixing member 500. The structures of the heat sink main body 100, the gripping member assembly 300, the elastic member 400, and the fixing member 500 are the same as that in the embodiment shown in FIG. 1 and FIG. 2, so that the features thereof are not repeated in the interest of brevity.

In this embodiment, the cover is omitted, and the fixing member 500 passes through the guiding slot 310 and is directly affixed to the heat sink main body 100. The gripping member 301 of the gripping member assembly 300 is movably connected to the heat sink main body 100. In particular, the gripping member 301 is able to move along the guiding slot 310 relative to the heat sink main body 100. The elastic member 400 is directly affixed to the heat sink main body 100 too. The elastic member 400 is disposed between the heat sink main body 100 and the gripping member 301, and protrudes from the lateral surface 120 of the heat sink main body 100.

Therefore, when the gripping member assembly 300 is in the first position relative to the heat sink main body 100, the top of the gripping member 301 is aligned with or below than the upper surface 110 of the heat sink main body 100. In other words, the gripping member 301 does not protrude from the upper surface 110 of the heat sink main body 100, so that the dimensions of the whole device can be miniaturized, and the problem that the heat sink device cannot put in the electronic device can be prevented. The gripping hole 340 of the gripping member 301 is situated the lateral wall 120 of the heat sink main body 100, and the gripping hole 340 of the gripping member 301 is overlapped with the heat sink main body 100 as observed from the direction facing the lateral wall 120 of the heat sink main body 100. Also, the elastic member 400 enters the first recess 320 of the gripping member 301, so as to affix the gripping member 301 at the first position.

When the gripping member assembly 300 moves relative to the heat sink main body 100 from the first position to the second position, the elastic member 400 enters the second recess 330 of the gripping member 301 to affix the gripping member assembly 300 at the second position. The gripping hole 340 of the gripping member 301 can be extended along a first direction (in the figures, it is parallel to the Z-axis) from the lateral wall 120 of the heat sink main body 100 and protrudes from the lateral wall 120. In other words, the gripping hole 340 of the gripping member 301 can protrude from the upper surface 110 of the heat sink main body 100. Therefore, the user can use the gripping hole 340 to transport the gripping member assembly 300, and the cover 200 and the heat sink main body 100 connected thereto.

Moreover, it should be noted that, the mechanical arms 600 shown in FIG. 6 to FIG. 6 can also use to grip the heat sink main body 100 in this embodiment. In detail, the protruding pillar 611 on the telescopic clamp 610 of the mechanical arm 600 in FIG. 6 can enter the through hole 350 to grip, the magnetic member 620 of the mechanical arm 600 in FIG. 7 can be in contact with the upper surface 110 of the heat sink main body 100 to attract the heat sink main body 100, and the vacuum suction nozzle 630 of the mechanical arm 600 in FIG. 8 can be in contact with the upper surface 110 of the heat sink main body 100 to suck the heat sink main body 100.

In summary, an embodiment of the invention provides a heat sink device, including a heat sink main body and a gripping member assembly. The gripping member assembly has a pair of gripping members respectively disposed on opposite lateral walls of the heat sink main body. Each of the gripping members includes a gripping hole. When the gripping member assembly is in a first position relative to the heat sink main body, the gripping holes are situated at the lateral walls of the heat sink main body. When the gripping member assembly moves relative to the heat sink main body from the first position to a second position, the gripping holes extend along a first direction and protrude from the lateral walls of the heat sink main body.

An embodiment of the invention also provides a heat sink device, including a heat sink main body, a cover, and a gripping member assembly. The cover is affixed to the heat sink main body. The gripping member assembly has a pair of gripping members respectively disposed on opposite lateral walls of the heat sink main body. Each of the gripping members includes a gripping hole. When the gripping member assembly is in a first position relative to the heat sink main body, the gripping holes are situated at the lateral walls of the heat sink main body. When the gripping member assembly moves relative to the heat sink main body from the first position to a second position, the gripping holes extend along a first direction and protrude from the lateral walls of the heat sink main body.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A heat sink device, comprising:

a heat sink main body, having an upper surface and opposite lateral walls, wherein the upper surface is connected between the opposite lateral walls; and a gripping member assembly, having a pair of gripping members respectively disposed on the opposite lateral walls of the heat sink main body, wherein each of the gripping members has a gripping hole, wherein when the gripping member assembly is in a first position relative to the heat sink main body, the gripping holes are situated at the lateral walls of the heat sink main body, wherein when the gripping member assembly moves relative to the heat sink main body from the first position to a second position, the gripping holes are extended along a first direction and protrude from the lateral walls and the upper surface of the heat sink main body along the first direction, wherein the first direction is substantially perpendicular to the upper surface.

2. The heat sink device as claimed in claim 1, wherein each gripping member has at least one guiding slot, and the heat sink device comprises a fixing member passing through the guiding slot and connected to the heat sink main body.

3. The heat sink device as claimed in claim 1, wherein each gripping member comprises a first recess and a second recess, and the heat sink device comprises an elastic member disposed between the heat sink main body and one of the gripping members, wherein when the gripping member assembly is in the first position relative to the heat sink main body, the elastic member enters the first recess, wherein when the gripping member assembly is in the second position relative to the heat sink main body, the elastic member enters the second recess.

4. The heat sink device as claimed in claim 1, wherein each gripping member comprises a through hole corresponding to a protruding pillar on a telescopic clamp of a mechanical arm.

5. The heat sink device as claimed in claim 1, wherein the heat sink device provides a magnetic member or a vacuum suction nozzle disposed on a mechanical arm for gripping the heat sink main body.

6. A heat sink device, comprising:

a heat sink main body, having an upper surface and opposite lateral walls, wherein the upper surface is connected between the opposite lateral walls;

a cover, affixed to the heat sink main body; and a gripping member assembly, having a pair of gripping members respectively disposed on the opposite lateral walls of the heat sink main body, wherein each of the gripping members has a gripping hole, wherein when the gripping member assembly is in a first position relative to the heat sink main body, the gripping holes are situated at the lateral walls of the heat sink main body, wherein when the gripping member assembly moves relative to the heat sink main body from the first position to a second position, the gripping holes are extended along a first direction and protrude from the lateral walls and the upper surface of the heat sink main body along the first direction, wherein the first direction is substantially perpendicular to the upper surface.

7. The heat sink device as claimed in claim 6, wherein each gripping member comprises a guiding slot, and the heat sink device comprises a fixing member passing through the guiding slot and connected to the cover.

8. The heat sink device as claimed in claim 6, wherein each gripping member comprises a first recess and a second recess, and the heat sink device comprises an elastic member disposed between the cover and one of the gripping members, wherein when the gripping member assembly is in the first position relative the heat sink main body, the elastic member enters the first recess, wherein when the gripping member assembly is in the second position relative to the heat sink main body, the elastic member enters the second recess.

9. The heat sink device as claimed in claim 6, wherein the heat sink device provides a magnetic member or a vacuum suction nozzle disposed on a mechanical arm for gripping the heat sink main body.

10. The heat sink device as claimed in claim 6, wherein each gripping member comprises a through hole corresponding to a protruding pillar on a telescopic clamp of a mechanical arm.

11. The heat sink device as claimed in claim 10, wherein a depression portion is formed on the cover, and the depression portion corresponds to the through hole when the gripping member assembly is in the first position relative to the heat sink main body.

* * * * *